(12) United States Patent
Mukai

(10) Patent No.: US 6,751,243 B2
(45) Date of Patent: Jun. 15, 2004

(54) SEMICONDUCTOR DEVICE WITH QUANTUM DOTS HAVING HIGH CARRIER INJECTION EFFICIENCY, ITS MANUFACTURE METHOD, AND SEMICONDUCTOR LASER DEVICE

(75) Inventor: Koki Mukai, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 161 days.

(21) Appl. No.: 09/978,207

(22) Filed: Oct. 17, 2001

(65) Prior Publication Data
US 2002/0075924 A1 Jun. 20, 2002

(30) Foreign Application Priority Data
Dec. 15, 2000 (JP) ........................ 2000-381842

(51) Int. Cl.[7] .................... H01S 5/34; H01L 29/06
(52) U.S. Cl. .................................. 372/45; 257/14
(58) Field of Search ................ 372/45; 257/14

(56) References Cited

U.S. PATENT DOCUMENTS 5,608,229 A * 3/1997 Mukai et al. ............... 257/14
5,614,435 A * 3/1997 Petroff et al. ............... 117/85
5,710,436 A * 1/1998 Tanamoto et al. .......... 257/14
6,541,788 B2 * 4/2003 Petroff et al. .............. 257/21

OTHER PUBLICATIONS

T. Fukui, et al., GaAs Tetrahedral Quantum Dot Structure Fabricated using Selective Area Metalorganic Chemical Vapor Deposition, App. Phys. Letter 58(18), May 6, 1991, pp. 2018–2020.

S.K. Mathis, et al., Strain Relaxation of InGaAs by Lateral Oxidation of AlAs, J. Vac. Sci. Technol. B18(4), Jun./Aug. 2000, pp. 2066–2071.

* cited by examiner

Primary Examiner—James W. Davie
(74) Attorney, Agent, or Firm—Armstrong, Kratz, Quintos, Hanson & Brooks, LLP

(57) ABSTRACT

A plurality of quantum dots are distributed dispersedly on the principal surface of a substrate comprising a first semiconductor. A cover layer comprising a second semiconductor is formed on a virtual plane on which the quantum dots are distributed. A barrier layer is disposed on the virtual plane at least in an area not disposed with the quantum dots. The barrier layer comprises a third semiconductor or insulator having a band gap wider than band gaps of the first and second semiconductors. A semiconductor device is provided which can prevent an injection efficiency of carriers into quantum dots.

7 Claims, 6 Drawing Sheets

SEMICONDUCTOR DEVICE WITH QUANTUM DOTS HAVING HIGH CARRIER INJECTION EFFICIENCY, ITS MANUFACTURE METHOD, AND SEMICONDUCTOR LASER DEVICE

This application is based on Japanese Patent Application 2000-381842, filed on Dec. 15, 2000, the entire contents of which are incorporated herein by reference.

BACKGROUND OF THE INVENTION

1) Field of the Invention

The present invention relates to semiconductor devices with quantum dots, manufacture manufacturing methods thereof, and semiconductor laser devices, and more particularly to semiconductor devices utilizing carriers injected into quantum dots, manufacture methods thereof, and semiconductor laser devices utilizing luminescence by recombination of carriers in quantum dots.

2) Description of the Related Art

Under the development of semiconductor processes, nano-meter scale crystal growth technologies and fine patterning technologies are being used for the manufacture of semiconductor devices. By utilizing growth and fine patterning technologies, the integration of semiconductor integrated circuit devices has been improved as a matter of course, and devices utilizing the effects of quantum mechanics, such as quantum well laser devices, are being used in practice.

Quantum dot structures have drawn attention as the ultimate structure based upon quantum mechanics. A quantum dot is an ultra fine structure having an energy level lower than a potential of a nearby region and being able to three-dimensionally confine carriers in an ultra fine region. Only two electrons can exist in one quantum dot at the ground level on the conduction band side. If a quantum dot is used as an active region of a laser device, interaction between electrons and holes can be made efficient. A laser device using quantum dots is expected to be a device which exceeds the limit of laser devices using a two-dimensionally extending quantum well layer, from the viewpoint of an oscillation threshold value, the temperature characteristics of the oscillation threshold value and the like. Studies of semiconductor devices utilizing quantum dots are vigorous, such as quantum dot memory devices utilizing the hole burning effects.

Techniques are known which artificially form quantum dots by using fine patterning technologies. Examples of a quantum dot forming method are: lithography with electron beams; a method of disposing quantum dots on vertices of pyramid crystals stacked on a mask pattern (GaAs tetrahedral quantum dot structures fabricated using selective area metal organic chemical vapor deposition, T. Fukui et al., Appl. Phys. Lett. 58(18), May 6, 1991); a method of disposing quantum dots on vertices of quadrilateral pyramids formed under a mask pattern; a method utilizing initial lateral growth of crystals on a slanted substrate; a method utilizing atom manipulation based upon STM (scanning tunneling microscopy); and the like. These methods have the common aspect that semiconductor materials are artificially processed. These methods are therefore advantageous in that the position of each quantum dot can be controlled freely.

Another method of forming quantum dots by themselves is known. The phenomenon that quantum dots are formed by themselves is called self-organization. Specifically, a semiconductor layer is formed through vapor phase epitaxial growth under the specific conditions of lattice mismatch. In this case, not a film which two-dimensionally and uniformly extends on an underlying surface but a three-dimensional fine structure (quantum dot structure) is formed by itself. With this method, as compared to artificial fine patterning, a quantum dot structure can be formed in which quantum dots are distributed at a higher density and each quantum dot has a high quality.

The best known one of self-organization of quantum dots is the Stranski-Krastanov mode (SK mode). During the growth in the SK mode, a two-dimensionally extending thin film (wetting layer) is grown initially on an underlying surface, and as source material continues to be supplied, quantum dots are formed by themselves. The quantum dots formed in the SK mode are buried in a quantum well layer so that the wavelength of luminescence of quantum dots can be controlled. Quantum dots having a uniform size can be formed by the SK mode.

Although the progress of quantum dot forming technologies is remarkable, some problems of application of a quantum dot structure to semiconductor devices are becoming distinct. One of them is a low efficiency of injecting carriers in quantum dots, and another is that an efficiency of injecting carriers to the ground level is lowered by the phonon bottleneck phenomenon.

Figure 1A:
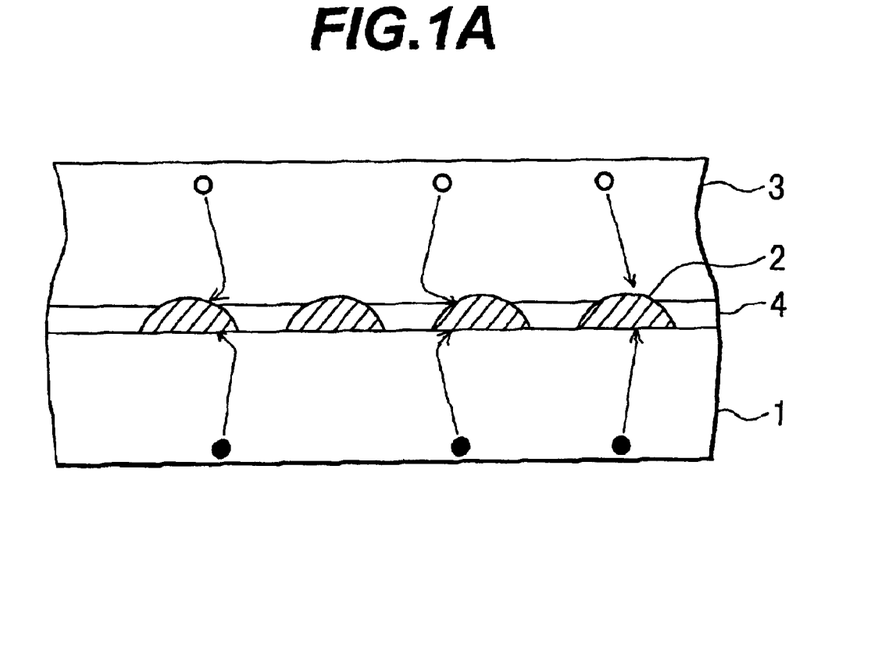
FIG. 1A is a cross sectional view of a semiconductor device according to a first embodiment of the invention.
Figure 1B:
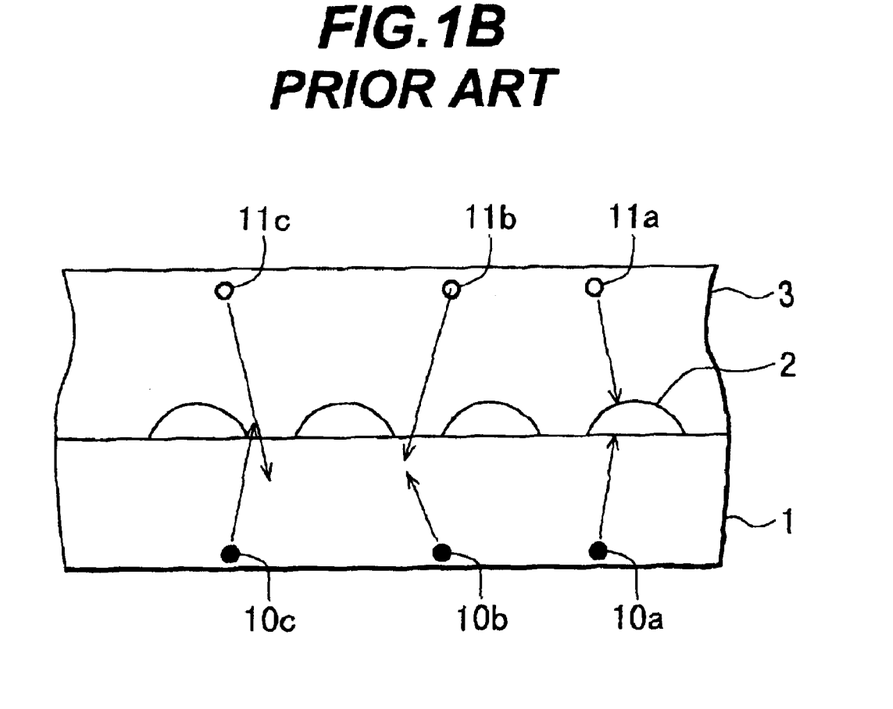
FIG. 1B is a cross sectional view of a conventional semiconductor device with quantum dots.

With reference to FIG. 1B, the reason why the carrier injection efficiency of quantum dots is low will be described. FIG. 1B is a cross sectional view showing an example of a conventional quantum dot structure. On the surface of a semiconductor substrate 1 having an n-type conductivity, a plurality of quantum dots 2 are distributed dispersedly. A semiconductor layer 3 having a p-type conductivity is formed on the surface of the semiconductor substrate 1, covering the surfaces of the quantum dots 2. As a forward voltage existing between the semiconductor substrate 1 and semiconductor layer 3 is applied, electrons $10a$ in the n-type semiconductor substrate 1 and holes $11a$ in the p-type semiconductor layer 2 are injected into the quantum dots 2.

However, since the quantum dots are distributed dispersedly, some electron $10c$ and hole $11c$ are transported to the p-type semiconductor layer 3 and n-type semiconductor substrate 1 without being injected into the quantum dot 2. Some electron $10b$ and hole $11b$ are recombined in a region other than the quantum dots. Therefore, only a portion of carriers contributing to the current is injected to the quantum dots 2. If such quantum dots are used for a semiconductor laser device, a lowered carrier injection efficiency of quantum dots results in lower luminescence efficiency.

The photon bottleneck phenomenon is the phenomenon that relaxation of carriers to a discrete level (transition from a higher level to a lower level) is suppressed by the conservation of energy. Quantum dots have a delta state density function so that optical phonons are related to carrier relaxation and carrier relaxation becomes difficult to occur. It is reported that carrier relaxation of quantum dots is slower than that in a quantum well layer because of the phonon bottleneck phenomenon (for example, Physical Review B54, R5243, 1996).

SUMMARY OF THE INVENTION

It is an object of the present invention to provide a semiconductor device and its manufacture method capable of preventing the carrier injection efficiency of quantum dots from being lowered.

It is another object of the present invention to provide a semiconductor device and its manufacture method capable of mitigating the difficulty of carrier relaxation by the phonon bottleneck phenomenon.

It is another object of the present invention to provide a semiconductor laser device having high luminescence efficiency by raising the carrier injection efficiency of quantum dots.

According to one aspect of the present invention, there is provided a semiconductor device comprising: a substrate comprising a first semiconductor and having a principal surface; a plurality of quantum dots distributed dispersedly on the principal surface; a cover layer comprising a second semiconductor and formed on a plane on which the quantum dots are distributed; and a barrier layer comprising insulator or third semiconductor having a band gap wider than band gaps of the first and second semiconductors and disposed on the plane on which the quantum dots are distributed and at least in a partial area of an area not disposed with the quantum dots.

While current flows between the substrate and cover layer, carriers cannot pass through the barrier layer so that the injection efficiency of carriers into the quantum dots can be improved.

According to another aspect of the present invention, there is provided a method of manufacturing a semiconductor device, comprising the steps of: forming quantum dots distributed dispersedly on a principal surface of semiconductor; forming a first layer comprising Al-containing compound semiconductor on the principal surface in an area not disposed with the quantum dots; covering the quantum dots and the first layer with a second layer comprising semiconductor; exposing side faces of the first layer; and oxidizing the first layer from the exposed side faces.

Since the oxidized first layer exhibits electrical insulation, the oxidized first layer functions as the barrier layer so that the injection efficiency of carriers into the quantum dots can be improved.

According to another aspect of the present invention, there is provided a semiconductor laser device comprising: a substrate comprising first semiconductor of a first conductivity type; a first separation confinement hetero layer formed on a surface of the substrate; a plurality of quantum dots distributed dispersedly on the first separation confinement hetero layer; a second separation confinement hetero layer formed on a plane on which the quantum dots are distributed; a barrier layer disposed between the first and second separation confinement hetero layers, on the plane on which the quantum dots are distributed and at least in a partial area of an area not disposed with the quantum dots, the barrier layer comprising insulator or semiconductor having a band gap wider than band gaps of the first and second separation confinement hetero layers; a clad layer formed on the second separation confinement hetero layer and comprising semiconductor of a second conductivity type opposite to the first conductivity type; and a pair of electrodes for applying a voltage existing between the substrate and the clad layer.

Because the barrier layer is disposed between the first and second separation confinement hetero layers, it is possible to improve the injection efficiency of carriers into the quantum dots. Luminescence efficiency can therefore be raised.

DETAILED DESCRIPTION OF THE PREFERRED EMBODIMENTS

FIG. 1A is a cross sectional view of a semiconductor device according to a first embodiment of the invention. On the surface of a substrate 1 made of n-type GaAs, a plurality of quantum dots 2 made of $In_{0.5}Ga_{0.5}As$ are distributed dispersedly. The size of each quantum dot 2 in the in-plane direction is about 10 nm, and a height thereof is about 5 to 10 nm. A barrier layer 4 covers the surface of the GaAs substrate 1 in an area not disposed with the quantum dots 2. A p-type GaAs layer 3 is formed on the quantum dots 2 and barrier layer 4.

The quantum dots 2 are formed by molecular beam epitaxy (MBE) by using the self-organization. For example, the quantum dots 2 are formed under the conditions of an In source material temperature of 750° C., a Ga source material temperature of 900° C., an As source material temperature of 300° C., a substrate temperature of 500° C., and a growth speed of 0.1 mono-layer per second.

In some cases, a wetting layer having a thickness corresponding to several atom layers covers the surface of the GaAs substrate 1 not formed with the quantum dots 2.

Next, a method of forming the barrier layer 4 will be described. After the quantum dots 2 are formed, an AlAs layer is grown on the GaAs substrate 1 by MBE. This AlAs layer hardly grows on the quantum dots 2 so that the AlAs layer covers the substrate of the GaAs substrate 1 not covered with the quantum dots 2. After the p-type GaAs layer 3 is grown, the AlAs layer disposed between the GaAs substrate 1 and GaAs layer 3 is oxidized from its side faces. As oxidation propagates along the lateral direction, almost the whole region of the AlAs layer is oxidized to form an insulating barrier layer. In this case, the GaAs substrate 1, GaAs layer 3 and quantum dots 2 are not oxidized. Since the p-type GaAs layer 3 is grown and thereafter the underlying AlAs layer is oxidized, the p-type GaAs layer 3 is an epitaxially grown layer inheriting the crystallinity of the surface of the GaAs substrate 1.

Next, with reference to FIG. 2A, the oxidation conditions suitable for the AlAs layer will be described.

A lamination structure was formed by MBE. The lamination structure had an AlAs layer of 30 nm in thickness sandwiched between Al$_{0.6}$Ga$_{0.4}$As thick layers and formed over a GaAs substrate. This lamination structure was partially etched to leave a ridge structure having a width of about 20 μm. This etching can be performed by using etchant made of phosphoric acid, hydrogen peroxide and water mixed at a volume ratio of 1:1:10. The density of phosphoric acid before mixture was 85% and that of hydrogen peroxide was 31%. The substrate with the ridge structure being left was subjected to a heat treatment in a water vapor atmosphere. Oxidation propagated along the lateral direction from the side faces of the AlAs layer 21 exposed on the sidewalls of the ridge structure.

Figure 2A:
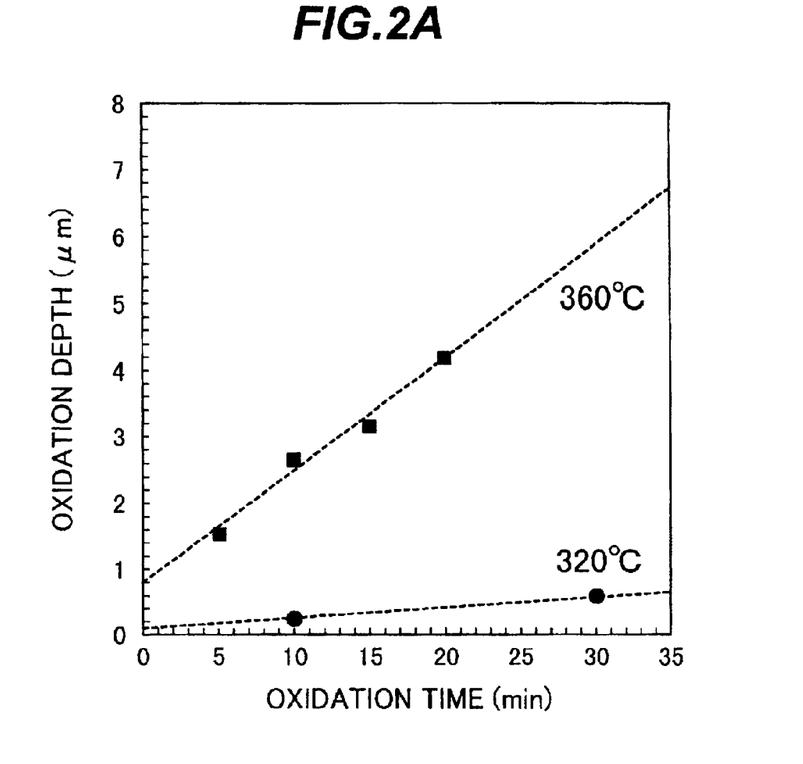
FIG. 2A is a graph showing an oxidation depth of an AlAs layer as a function of an oxidation time, the oxidation depth having been measured by evaluation experiments of selective oxidation at temperatures of 360° C. and 320° C.

FIG. 2A shows the relation between an oxidation temperature, an oxidation time and an oxidation depth. The abscissa represents the oxidation time in the unit of "minute", and the ordinate represents the oxidation depth in the unit of "μm". Square symbols in FIG. 2A correspond to an oxidation temperature of 360° C. and circle symbols correspond to an oxidation temperature of 320° C. The oxidation depth was measured by observing the cross section of the ridge structure with a scanning electron microscope (SEM). Under the heat treatment conditions at these temperatures, the AlGaAs layer was not substantially oxidized.

It can be seen from FIG. 2A that the AlAs layer was oxidized to a thickness of about 6 μm by the heat treatment for 30 minutes at a temperature of 360° C. in the water vapor atmosphere. For example, if the width of the ridge structure is set to 12 μm or narrower, the whole region of the AlAs layer can be oxidized in 30 minutes at a temperature of 360° C. By adjusting the oxidation temperature and time in accordance with the width of the ridge structure, the whole region of the AlAs layer of the ridge structure can be oxidized.

Figure 2B:
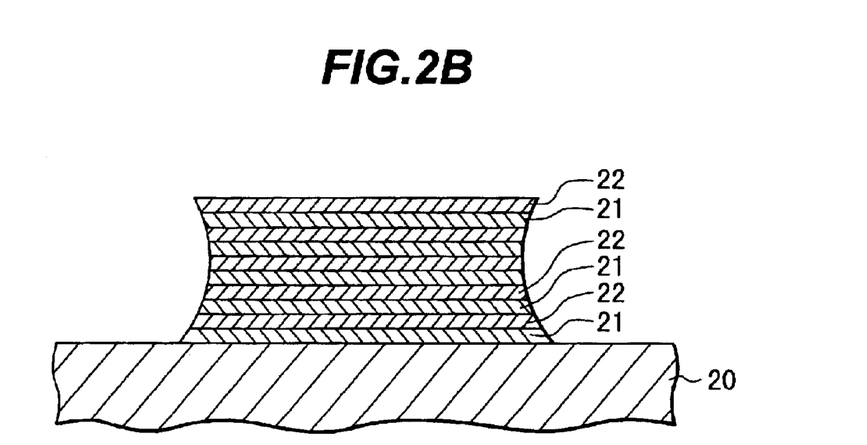
FIG. 2B is a cross sectional view of a lamination structure used for other evaluation experiments of selective oxidation.

FIG. 2B is a cross sectional view of a sample used for other evaluation experiments. On a GaAs substrate 20, a ridge structure was formed which is made of InAlAs layers 21 of 106 nm in thickness and InGaAs layers 22 of 93 nm in thickness alternately stacked one upon another. This lamination structure was subjected to a heat treatment in a water vapor atmosphere. Oxidation occurred only in the InAlAs layers 21 containing Al, and the InGaAs layers 22 were oxidized not at all. This means that quantum dots of InGaAs distributed in an Al-containing compound semiconductor layer are not oxidized although the compound semiconductor layer is oxidized.

In the quantum dot structure of the first embodiment shown in FIG. 1A, the barrier layer 4 is disposed between the GaAs substrate 1 and GaAs layer 3 in the region where the quantum dots 2 are not disposed. As a forward voltage existing between the GaAs substrate 1 and GaAs layer 3 is applied, electrons in the GaAs substrate 1 and holes in the GaAs layer 3 move toward the interface between the GaAs substrate 1 and GaAs layer 3. These carriers are not injected into the barrier layer 4 because of its potential barrier, but injected into the quantum dots 2 having a lower potential. The carrier injection efficiency of the quantum dots can therefore be raised.

Next, with reference to FIGS. 3A to 3C, a semiconductor device with quantum dots according to a second embodiment will be described.

Figure 3A:
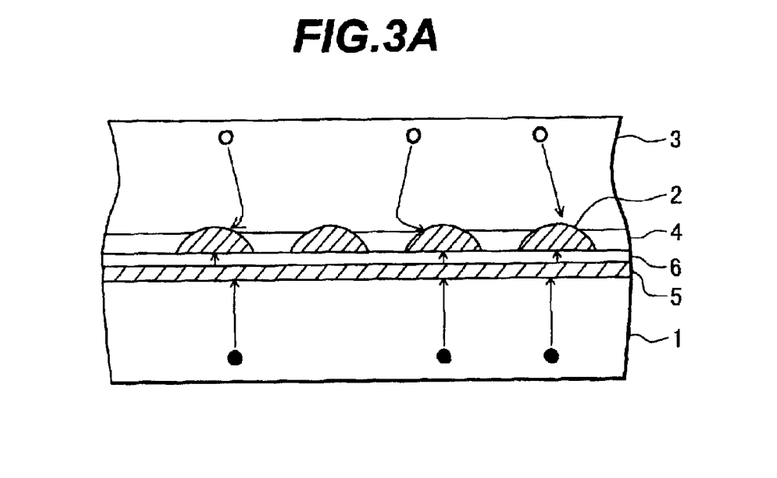
FIG. 3A is a cross sectional view of a semiconductor device according to a second embodiment.

FIG. 3A is a cross sectional view of a semiconductor device according to a second embodiment. In the first embodiment shown in FIG. 1A, the quantum dots and barrier layer 4 are formed directly on the surface of the GaAs substrate 1. In the second embodiment, on the surface of a GaAs substrate 1, a quantum well layer 5 of InGaAs and a tunneling layer 6 of GaAs are stacked in this order, and on the surface of the tunneling layer 6, quantum dots 2 and a barrier layer 4 are formed.

An in composition ratio of the quantum well layer 5 is 0.2 to 0.3 and a thickness thereof is 10 to 30 nm. A thickness of the tunneling layer 6 is 5 nm or thinner so that carriers can pass through the tunneling layer 6 by the tunneling phenomenon.

Figure 3B:
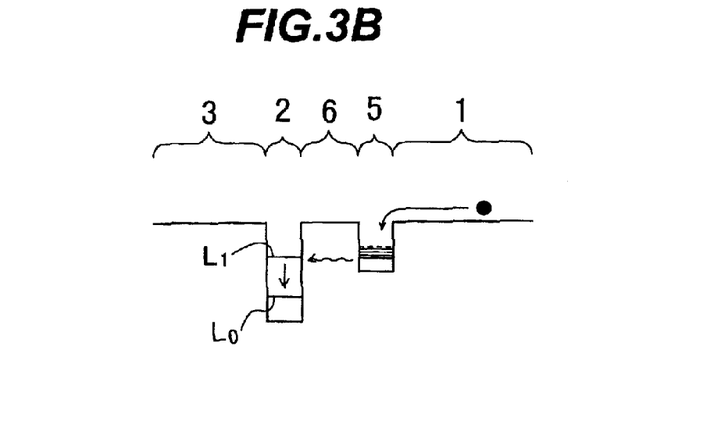
FIG. 3B is an energy band diagram showing the energy level relation between a quantum dot and a quantum well layer.
Figure 3C:
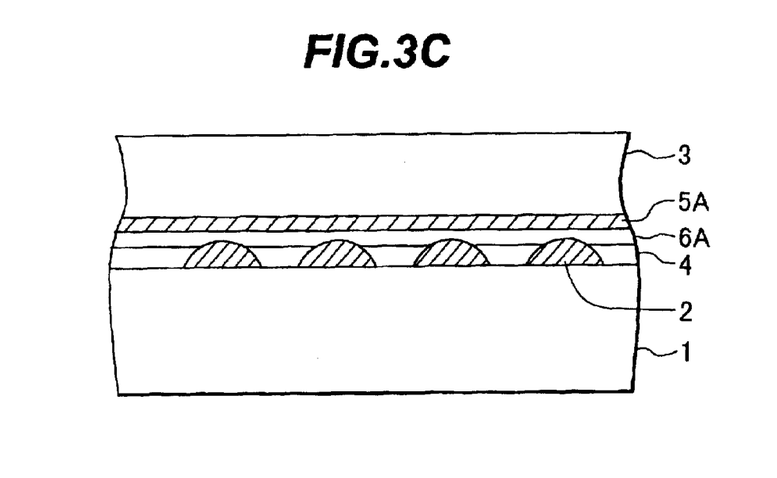
FIG. 3C is a cross sectional view of a semiconductor device according to a modification of the second embodiment.

FIG. 3B is an energy band diagram of the GaAs substrate 1, quantum well layer 5, tunneling layer 6, quantum dot 2 and GaAs layer 3 at the lower end of the conduction band. The energy band diagram shown in FIG. 3B is in the state that a forward voltage existing between the GaAs substrate 1 and GaAs layer 3 is applied.

An excited electron in the conduction band of the GaAs substrate 1 is injected into the quantum well layer 5 and occupies its ground state. Because of resonance between the ground state of the quantum well layer 5 and the first level $L_1$ of the quantum dot 2, the electron in the quantum well layer 5 moves to the first level $L_1$ of the quantum dot 2 by the tunneling phenomenon. The electron which occupies the first level of the quantum dot 2 makes transition to the ground level $L_0$ of the quantum dot 2. In this manner, an electron is injected into the quantum dot 2 via the quantum well layer 5.

If the quantum well layer 5 does not exist, an electron in the conduction band of the GaAs substrate 1 is required to be injected into the quantum dot 2 at its first level. However, the electron in the conduction band is hard to be captured by the quantum dot 2 because of the phonon bottleneck phenomenon. The influence of the phonon bottleneck phenomenon can be avoided by injecting an electron via the quantum well layer 5 into the quantum dot 2. An electron moves at high speed from the quantum well layer 5 to the quantum dot 2 by the tunneling phenomenon. It is therefore possible to increase a speed of capturing an electron in the quantum dot 2.

In the structure of the first embodiment shown in FIG. 1A, a defect level may be formed at the interface between the GaAs substrate 1 and barrier layer 4. In the second embodiment shown in FIG. 3A, a carrier does not reach the interface between the GaAs tunneling layer 6 and barrier layer 4. Therefore, even if a defect level is formed at this interface, a carrier is prevented from being trapped at this defect level.

In the second embodiment shown in FIG. 3A, the quantum well layer 11 5 and tunneling layer 6 are disposed between a virtual plane on which the quantum dots 2 are distributed and the GaAs substrate 1. As shown in FIG. 3C, the quantum well layer 5 and tunneling layer 6 may be disposed between the virtual plane on which the quantum dots 2 are distributed and the p-type GaAs layer 3. The quantum well layer and tunneling layer may be disposed on both sides of the virtual plane on which the quantum dots 2 are distributed.

Figure 4:
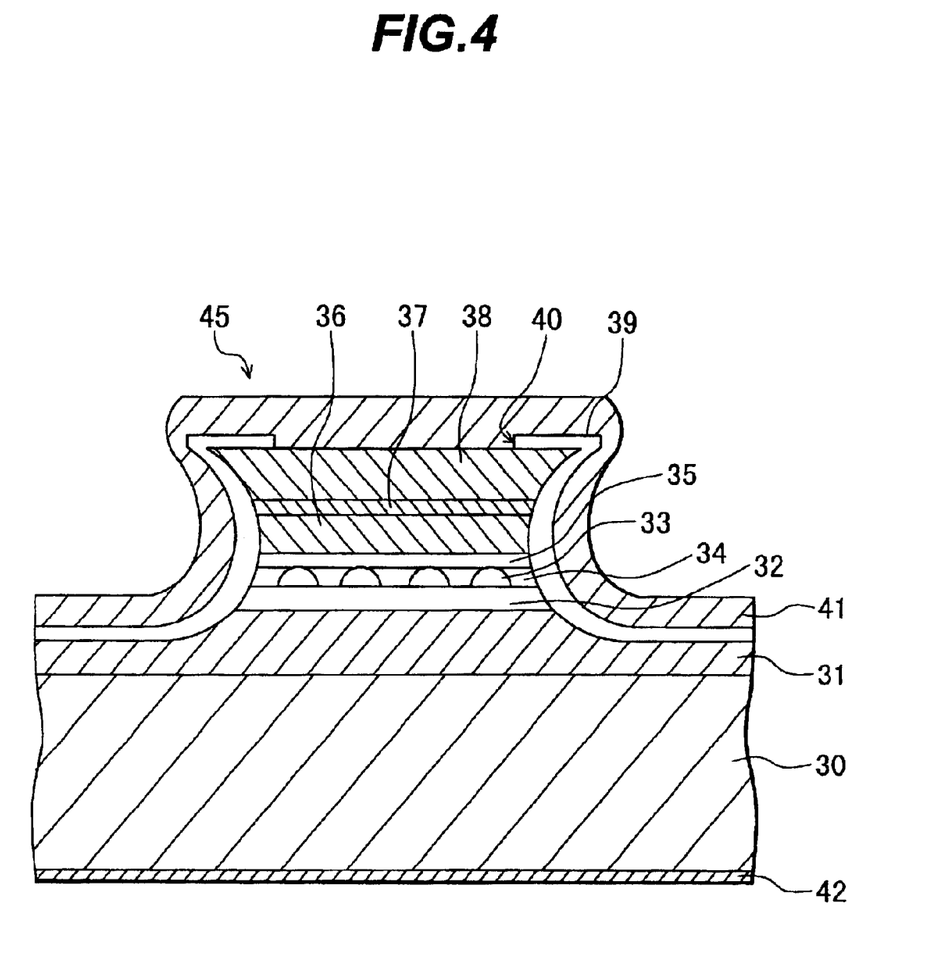
FIG. 4 is a cross sectional view of a semiconductor laser device according to an embodiment of the invention.

FIG. 4 is a cross sectional view of a semiconductor laser device using the quantum dot structure of the first embodiment.

Formed on the principal surface of the (001) plane of an n-type GaAs substrate 30 is an n-type clad layer 31 of n-type Al$_{0.4}$Ga$_{0.6}$As having a thickness of 1 μm. Formed on this n-type clad layer 31 is a separation confinement hetero layer (SCH layer) 32 of GaAs having a thickness of 100 nm. A plurality of quantum dots 33 are distributed dispersedly on the surface of the separation confinement hetero layer 32. A barrier layer 34 covers the surface of the separation confinement hetero layer 32 in an area not disposed with the quantum dots 33. The quantum dot 33 is made of InGaAs. The barrier layer 34 is formed by oxidizing an AlAs layer formed by MBE.

Formed on the quantum dots 33 and barrier layer 34 is a separation confinement hetero layer 35 of GaAs having a thickness of 100 nm. Formed on the separation confinement hetero layer 35 is a p-type clad layer of p-type $Al_{0.4}Ga_{0.6}As$ having a thickness of 1 μm. Formed on this p-type clad layer 36 are an intermediate layer 37 of p-type $Al_{0.2}Ga_{0.8}As$ and a contact layer 38 of $p^+$-type GaAs. These layers are formed by MBE. The quantum dots 33 are formed by MBE in the SK mode. While the quantum dots 33 are grown by MBE, an AlAs layer is grown to be later oxidized to form the barrier layer 34.

A ridge 45 is left by partially etching the region from the upper surface of the contact layer 38 to the depth slightly deeper than the lower surface of the separation confinement hetero layer 32. This etching is performed by wet etching using mixed solution of phosphoric acid, hydrogen peroxide and water. After the ridge 45 is formed, the barrier layer 34 is formed by oxidizing the AlAs layer from its side faces. This oxidation is performed under the conditions that the clad layers of $Al_{0.4}Ga_{0.6}As$ are not oxidized.

The surface of the substrate with the ridge 45 is covered with an insulating film 39 of silicon oxide having a thickness of 250 nm. Formed through this insulating film 39 is an opening 40 for exposing the upper surface of the ridge 45. A p-side electrode 41 covers the upper surfaces of the insulating film 39 and the contact layer 38 exposed on the bottom of the opening 40. The p-side electrode 41 has a two-layer structure of a Ti layer and a Pt layer stacked in this order, and is in ohmic-contact with the contact layer 38.

Formed on the bottom surface of the GaAs substrate 30 is an n-side electrode 42. The n-side electrode 42 has a two-layer structure of an AuGe alloy layer and an Au layer stacked in this order, and is in ohmic-contact with the GaAs substrate 30.

Reflection facets are formed on opposite sides of the ridge 45 in the longitudinal direction thereof to define an optical resonator. As a forward voltage existing between the n-side electrode 42 and p-side electrode 41 is applied, carriers are injected into the quantum dots 33. Recombinations of electrons and holes in the quantum dots 33 radiate light. This light reciprocally moves in the optical resonator to generate stimulated emission.

In the semiconductor laser device shown in FIG. 4, the barrier layer 34 is disposed between the separation confinement hetero layers 32 and 35 in the region not disposed with the quantum dots 33. Therefore, similar to the first embodiment shown in FIG. 1A, the carrier injection efficiency of the quantum dots 33 can be raised. It is therefore possible to raise the luminescence efficiency.

A quantum well layer and a tunneling layer such as shown in FIG. 3A may be inserted between a virtual plane on which the quantum dots 33 shown in FIG. 4 are distributed and the separation confinement hetero layer 32 and between the virtual plane and the separation confinement hetero layer 35. With this structure, it is possible to prevent the carrier injection efficiency from being lowered by the phonon bottleneck phenomenon.

Figure 5A:
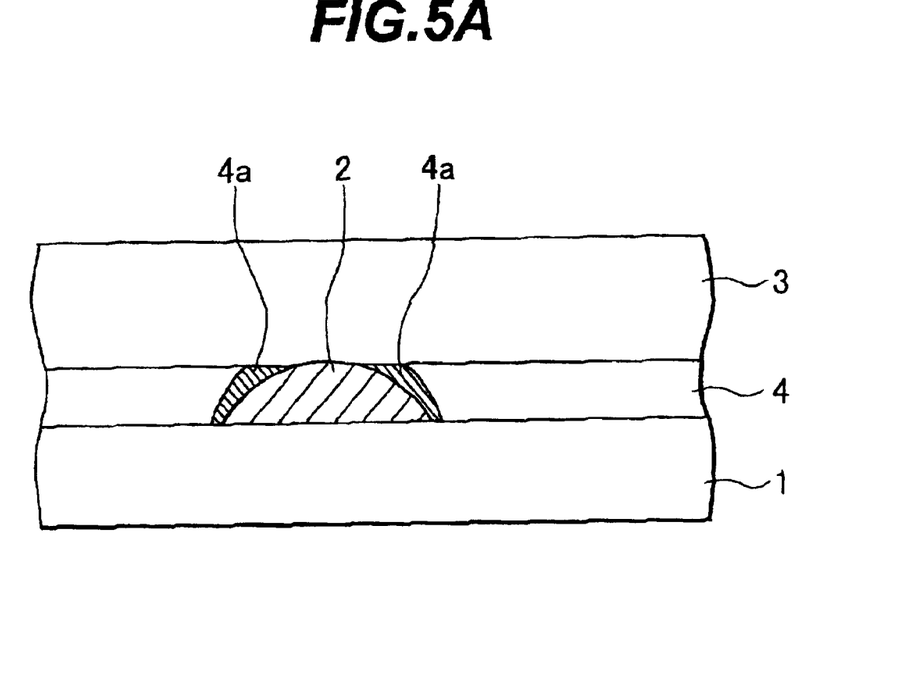
FIGS. 5A and 5B are cross sectional views of quantum dot structures according to modifications of the first and second embodiments.

Next, with reference to FIGS. 5A and 5B, quantum dot structures according to modifications of the above embodiments will be described.

In the first and second embodiments, by oxidizing the whole region of the AlAs layer, for example as shown in FIG. 1A, the barrier layer 4 is formed. If this oxidation is insufficient, as shown in FIG. 5A an AlAs region 4a not oxidized is left in the peripheral area of a quantum dot 2. Even if the AlAs region 4a not oxidized is left, the carrier injection efficiency can be raised if most of the region of the AlAs layer is oxidized. It is expected that the carrier injection efficiency is raised if at least a portion of the region of the AlAs layer is oxidized, more than that the barrier layer is not formed.

In the first and second embodiments, for example as shown in FIG. 1A, each quantum dot 2 is in direct contact with the p-type GaAs layer 3 formed thereon. If the AlAs layer to be later oxidized to form the barrier layer 4 is grown by MBE, the AlAs layer hardly grows on the quantum dot 2 but it grows on the surface of the GaAs substrate 1 with a priority over the other surfaces. In some cases, however, the AlAs layer also grows slightly on the quantum dot 2.

Figure 5B:
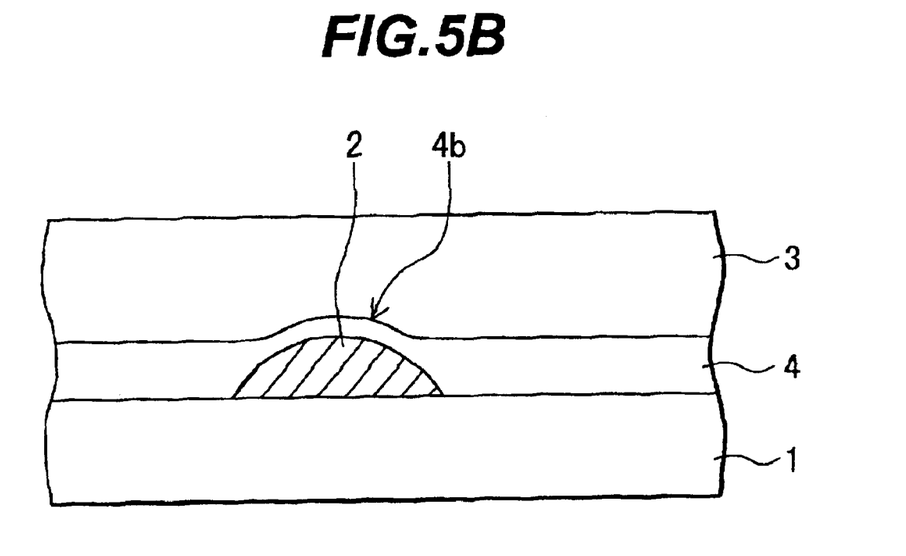

FIG. 5B is a cross sectional view of a quantum dot structure in which a thin AlAs layer was grown also on a quantum dot 2 and an upper covering region 4b formed by oxidizing the thin AlAs layer is left on the quantum dot 2. With this structure, the quantum dot is not direct contact with a p-type GaAs layer 3. However, if the upper covering region 4b is thin enough to allow carriers to pass through by the tunneling phenomenon, carriers can be injected into the quantum dot 2 at a sufficiently high probability.

In the embodiments shown in FIGS. 1A and 3A, although the barrier layer 4 is formed by oxidizing AlAs, it may be formed by oxidizing other compound semiconductors which contain Al. An oxidation speed of Al-containing compound semiconductor is dependent upon the composition ratio of Al. If the oxidation speed of compound semiconductor to be oxidized is sufficiently higher than that of compound semiconductor not to be oxidized, only the compound semiconductor to be oxidized can be selectively oxidized. As the material of the barrier layer 4, semiconductor material may be used which has a band gap wider than the band gaps of the GaAs substrate 1 and GaAs layer 3.

In the embodiments shown in FIGS. 1A and 3A, although GaAs is used as the substrate material and the quantum dot 2 is made of InGaAs, other materials may also be used. For example, InP may be used as the substrate material and the quantum dot is made of InAs. In this case, AlAs or AlInAs is oxidized to form the barrier layer.

Figure 6A:
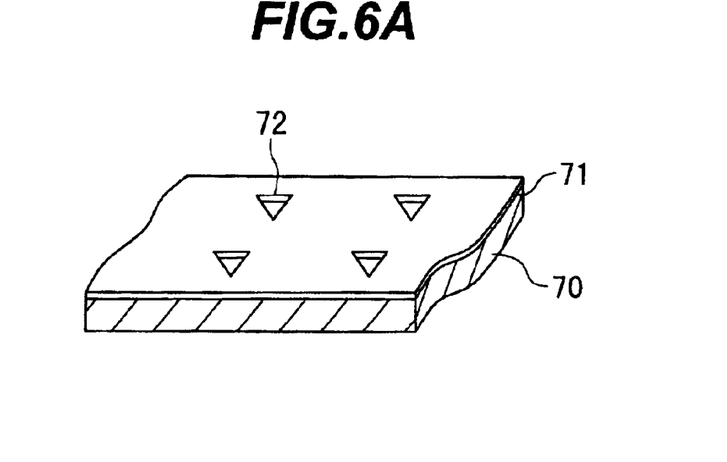
FIGS. 6A to 6C are partially broken perspective views illustrating a method of forming quantum dots by using fine patterning technologies.
Figure 6B:
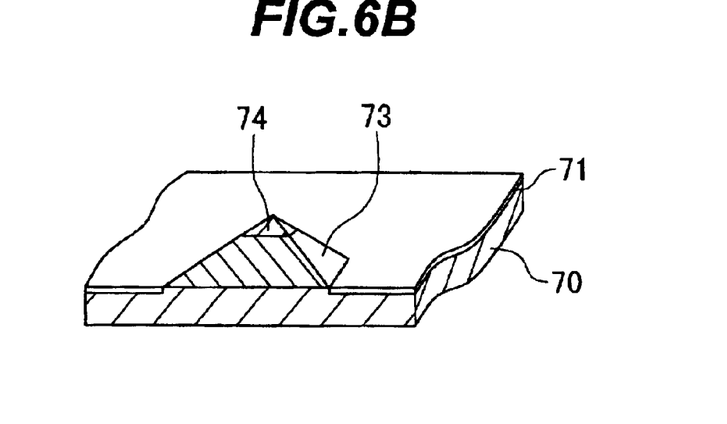
Figure 6C:
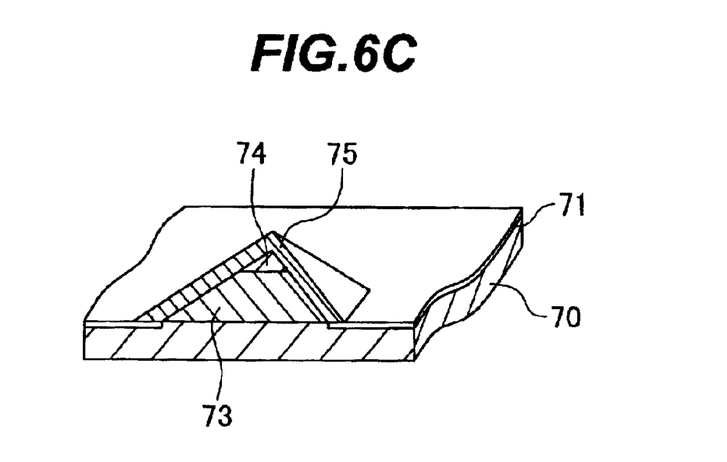

In the above embodiments, quantum dots are formed by utilizing the self-organization. Quantum dots may be formed by other methods. FIGS. 6A to 6C are perspective views illustrating a method of forming quantum dots presented by Fukui et al., in the Applied Physics Letter (Appl. Phys. Lett. 58(11), 6 May 1991).

As shown in FIG. 6A, on the surface of the (111) B plane of a GaAs substrate 70, a silicon oxide film 71 is formed. Triangular openings 72 are formed through the silicon oxide film 71 to expose the surface of the GaAs substrate 70. The triangular opening 72 is formed so that its three sides become in parallel with the [110], [011] and [101] directions of the GaAs substrate 70.

As shown in FIG. 6B, an AlGaAs layer 73 is epitaxially formed on the exposed surface of the substrate by MOCVD. FIG. 6B shows the cross section of one bisected opening 72. Under some growth conditions, the AlGaAs layer is deposited only on the (111) B plane, and it is hardly deposited on the {110} plane. Under such growth conditions, the AlGaAs layer 73 grows as a triangular pyramid having the {110} plane as its slanted surfaces. Deposition of the AlGaAs layer 73 is stopped before the region near the vertex of the triangular pyramid is deposited. A GaAs region 74 is grown in the region near the vertex of the triangular pyramid.

As shown in FIG. 6C, an AlGaAs layer 75 is deposited on the slanted surfaces of the triangular pyramid. Under the growth conditions different from those for the AlGaAs layer 73, the AlGaAs layer 75 can be grown also on the {110} plane.

In this manner, a fine GaAs region 74 surrounded by the AlGaAs layers 73 and 75 can be formed. Since the GaAs region 74 has a narrower band gap than those of the AlGaAs layers 73 and 75 surrounding the GaAs region 74, it can function as the quantum dot for three-dimensionally confining electrons.

Next, by using the quantum dot forming method illustrated in FIGS. 6A to 6C, a method of forming layers corresponding to the barrier layer 4 and p-type GaAs layer 3 of the first embodiment shown in FIG. 1A will be described.

In place of the AlGaAs layer 73 shown in FIG. 6B, a GaAs layer is formed, and in place of the GaAs region 74, an InGaAs region is formed. The AlGaAs layer 75 shown in FIG. 6C is not formed. In the state shown in FIG. 6B, the silicon oxide film 71 is removed to expose the surface of the GaAs substrate 70.

An AlAs layer is grown on the exposed surface of the GaAs substrate 70. A GaAs layer is grown covering the AlAs layer and InGaAs region 74. By oxidizing the AlAs layer from its side faces, the barrier layer 4 can be formed. By setting the thickness of the barrier layer 4 approximately equal to the height of the GaAs layer 73, the efficiency of injecting carriers into the quantum dots (InGaAs regions 74) can be increased.

The present invention has been described in connection with the preferred embodiments. The invention is not limited only to the above embodiments. It is apparent that various modifications, improvements, combinations, and the like can be made by those skilled in the art.

What I claim are:

1. A semiconductor device comprising:
   a substrate comprising a first semiconductor and having a principal surface;
   a plurality of quantum dots distributed dispersedly on the principal surface;
   a cover layer comprising a second semiconductor and formed over a plane on which said quantum dots are distributed; and
   a barrier layer comprising an insulator or a third semiconductor having a band gap wider than band gaps of the first and second semiconductors and disposed on the plane on which said quantum dots are distributed and at least in a partial area of an area not disposed with said quantum dots.

2. A semiconductor device according to claim 1, further comprising:
   a quantum well layer comprising a fourth semiconductor having a band gap narrower than band gaps of the first and second semiconductors and disposed between the principal surface and the plane on which said quantum dots are distributed or between the plane on which said quantum dots are distributed and said cover layer; and
   a tunneling layer disposed between said quantum well layer and the plane on which said quantum dots are distributed and having a thickness capable of serving as a potential barrier for energy levels in said quantum well layer and said quantum dots and allowing carriers to move between said quantum well layer and said quantum dots by a tunneling phenomenon.

3. A semiconductor device according to claim 2, wherein a composition and a thickness of said quantum well layer and a composition and a size of each of said quantum dots are selected so that carriers can move from an energy level in said quantum well layer to an energy level in each of said quantum dots by a resonance tunneling phenomenon.

4. A semiconductor device according to claim 1, wherein said quantum dots comprise InGaAs and said barrier layer comprises material obtained by oxidizing Al-containing compound semiconductor.

5. A semiconductor device according to claim 1, wherein said cover layer is a single crystal layer epitaxially grown by inheriting crystallinity of the principal surface of said substrate.

6. A semiconductor laser device comprising:
   a substrate comprising first semiconductor of a first conductivity type;
   a first separation confinement hetero layer formed over a surface of said substrate;
   a plurality of quantum dots distributed dispersedly on said first separation confinement hetero layer;
   a second separation confinement hetero layer formed on a plane on which said quantum dots are distributed;
   a barrier layer disposed between said first and second separation confinement hetero layers, on the plane on which said quantum dots are distributed and at least in a partial area of an area not disposed with said quantum dots, said barrier layer comprising insulator or semiconductor having a band gap wider than band gaps of said first and second separation confinement hetero layers;
   a clad layer formed on said second separation confinement hetero layer and comprising semiconductor of a second conductivity type opposite to the first conductivity type; and
   a pair of electrodes for applying a voltage existing between said substrate and said clad layer.

7. A semiconductor laser device according to claim 6, further comprising:
   a quantum well layer disposed between the plane on which said quantum dots are distributed and said first separation confinement hetero layer or between the plane on which said quantum dots are distributed and said second separation confinement hetero layer, said quantum well layer comprising semiconductor having a band gap narrower than band gaps of the first and second separation confinement hetero layers; and
   a tunneling layer disposed between said quantum well layer and the plane on which said quantum dots are distributed and having a thickness capable of serving as a potential barrier for energy levels in said quantum well layer and said quantum dots and allowing carriers to move between said quantum well layer and said quantum dots by a tunneling phenomenon.

* * * * *